(12) United States Patent
Hoang et al.

(10) Patent No.: US 10,234,248 B1
(45) Date of Patent: Mar. 19, 2019

(54) MICRO-ELECTRIC-PYROTECHNIC ENERGY-HARVESTING APPARATUS FOR MUNITIONS

(71) Applicant: Department of the Navy, Washington, DC (US)

(72) Inventors: Thinh Hoang, Beltsville, MD (US); Khoa Nguyen, Waldorf, MD (US); Daniel Corey Pines, Alexandria, VA (US); Troy Caruso, Sterling Heights, MI (US)

(73) Assignee: The United States of America as Represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 15/731,440

(22) Filed: Jun. 12, 2017

(51) Int. Cl.
*F42C 11/02* (2006.01)
*F42B 3/12* (2006.01)
*H01L 41/083* (2006.01)
*H02N 2/18* (2006.01)

(52) U.S. Cl.
CPC .......... *F42B 3/124* (2013.01); *F42C 11/02* (2013.01); *H01L 41/083* (2013.01); *H02N 2/183* (2013.01)

(58) Field of Classification Search
CPC .......... F41A 19/58; F41A 19/59; F41A 19/60; F41A 19/62; F42C 11/008; F42C 11/001; F42C 11/00; F42C 11/02; F42C 19/06; F42B 5/08
See application file for complete search history.

(56) References Cited

U.S. PATENT DOCUMENTS

| | | | | | |
|---|---|---|---|---|---|
| 2,849,957 | A | * | 9/1958 | Kuller | F23Q 2/287 102/210 |
| 2,970,545 | A | * | 2/1961 | Howe | F42C 11/02 102/210 |
| 3,324,317 | A | * | 6/1967 | Hazelet | F42C 11/02 102/210 |
| 3,622,814 | A | * | 11/1971 | Carlson | F42C 11/02 102/210 |
| 3,633,511 | A | * | 1/1972 | Maury | F42C 9/02 102/210 |
| 3,726,222 | A | * | 4/1973 | White | F42B 5/08 102/431 |
| 3,748,770 | A | * | 7/1973 | Mitchell | F41A 19/58 42/84 |

(Continued)

OTHER PUBLICATIONS http://www.eugeneleeslovercom/US-NAVY-BOOKS/1-No-10797-A-Chapter-3.html, p. 15 of 20 paragraph 3E3.

*Primary Examiner* — Derrick R Morgan
(74) *Attorney, Agent, or Firm* — Frederic J. Zimmerman

(57) ABSTRACT

A micro-electro-pyrotechnic energy-harvesting apparatus to harvest an incidental portion of a propellant energy utilized when a munition is fired freeing a magnet to strike an impact pin that strains a piezoelectric element. The piezoelectric element generates a collected voltage, which triggers a pyrotechnic initiator that, on activation, produces a straining force on a plurality of stacks of piezoelectric elements. The strained piezoelectric elements, in turn, generate a high voltage output sufficient to ignite the munition's explosive material. The apparatus may be quite small, for example, the cross-sectional size of a pen, which is about one centimeter, yet suitable for generating an electrical ignition of the explosive material.

20 Claims, 5 Drawing Sheets

(56) References Cited

U.S. PATENT DOCUMENTS

| | | | | |
|---|---|---|---|---|
| 3,963,966 A * | 6/1976 | Mohr | | F23Q 3/002 |
| | | | | 102/210 |
| 3,967,141 A * | 6/1976 | Gawlick | | H01L 41/113 |
| | | | | 310/339 |
| 4,026,214 A * | 5/1977 | Backstein | | F42C 11/02 |
| | | | | 102/210 |
| 4,176,608 A * | 12/1979 | Ambrosini | | F42C 15/40 |
| | | | | 102/210 |
| 4,417,518 A * | 11/1983 | Siebert | | F42C 9/148 |
| | | | | 102/212 |
| 4,603,635 A | 8/1986 | Boudreau | | |
| 5,012,740 A * | 5/1991 | Hardt | | F42C 1/12 |
| | | | | 102/216 |
| 5,303,495 A * | 4/1994 | Harthcock | | F41A 9/62 |
| | | | | 42/1.02 |
| 5,485,788 A * | 1/1996 | Corney | | F42B 5/08 |
| | | | | 102/202.1 |
| 6,666,843 B1 * | 12/2003 | Alexandre | | A61M 5/30 |
| | | | | 604/68 |
| 7,451,700 B1 | 11/2008 | Land | | |
| 7,506,586 B1 * | 3/2009 | Pereira | | F42C 11/008 |
| | | | | 102/207 |
| 8,522,682 B1 * | 9/2013 | Genson | | F42B 12/10 |
| | | | | 102/221 |
| 9,829,289 B1 * | 11/2017 | Burke | | B23K 1/0016 |
| 2003/0176839 A1 * | 9/2003 | Chiwanga | | A61M 5/2046 |
| | | | | 604/141 |
| 2007/0165487 A1 * | 7/2007 | Nutt | | E21B 31/18 |
| | | | | 367/25 |
| 2010/0101443 A1 * | 4/2010 | Rosales | | F42B 5/035 |
| | | | | 102/438 |
| 2013/0180423 A1 * | 7/2013 | Rastegar | | F42C 11/02 |
| | | | | 102/215 |
| 2013/0227949 A1 | 9/2013 | Robnik | | |
| 2017/0133954 A1 * | 5/2017 | Rastegar | | H02N 2/181 |

* cited by examiner

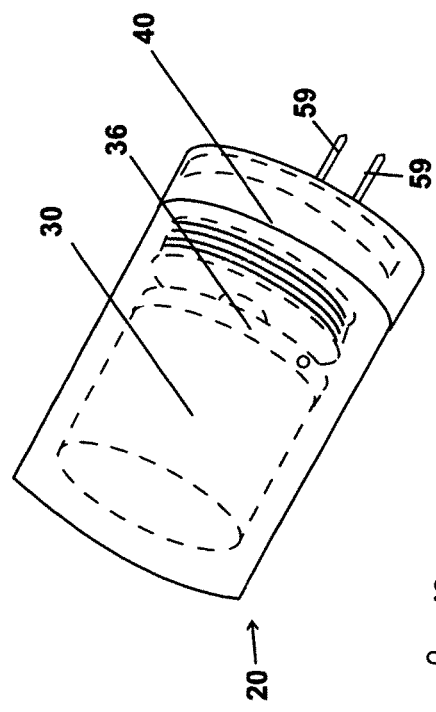
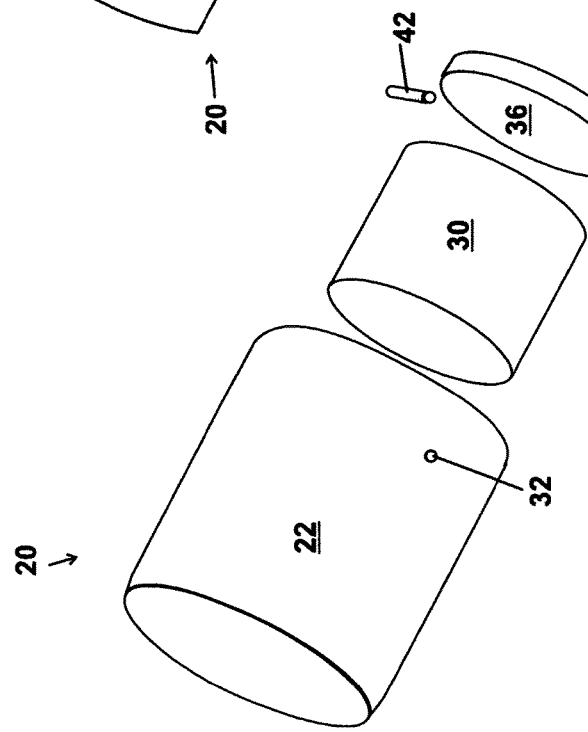
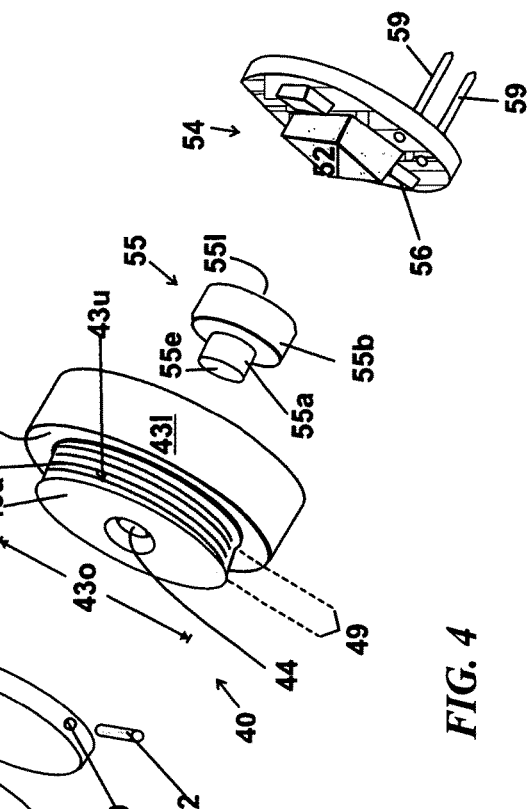
FIG. 3
FIG. 4

MICRO-ELECTRIC-PYROTECHNIC ENERGY-HARVESTING APPARATUS FOR MUNITIONS

STATEMENT OF GOVERNMENT INTEREST

The invention described herein may be manufactured and used by or for the Government of the United States of America for Governmental purposes without the payment of any royalties thereon or therefore.

BACKGROUND OF THE INVENTION

1. Field of the Invention

The invention relates generally to devices that generate an electrical energy that is sufficient to function as an igniter for a fuze, and more particularly to an apparatus that is a component of a fuze for a munition, where the apparatus harvests an incidental portion of a propellant energy utilized when a munition is fired. The apparatus amplifies the harvested energy, and it converts the harvested energy to a high output voltage energy for the fuze component.

2. Background

Electric spark fuze systems have been used to detonate munitions. The fuze plays an essential safety role in preventing accidental detonation of the munitions, and the system is instrumental in making the munitions safe to handle. There are a variety of technologies used in fuze systems.

Electrical fuze systems have historically utilized induction coils to create magnetic fields to amplify the voltage of a current into a spark, where the spark is sufficient to cause ignition. Substantially, a common element to electrical systems is the utilization of a battery for the EMF. A fuze system that does not rely on a battery would be beneficial, as all batteries have a shelf life. Therefore, the system that does not include battery energy is advantageous, where, instead, the energy is harvested. The harvested energy system should occupy a minimal volume space, it should have a 20-year shelf-life, it should not be corrosive, and it must be capable of operating over extreme temperature ranges irrespective of the length of time or rate of change.

SUMMARY OF THE INVENTION

The disclosed invention is a micro-electro-pyrotechnic energy-harvesting apparatus. The apparatus may be quite small, for example, the cross-sectional size of a pen, and yet is suitable for generating an electrical charge suitable as a fuze for a munition, for example a shell.

The apparatus includes a low output voltage module and a high output voltage module that are nominally lengthwise aligned. The apparatus in application is mounted and protected by one or more walls of the munition.

The low output voltage module has a covering housing, a magnetic proof mass that is restrained and separated from a metal base plate by a support flat plate with a plurality of shear pins, where a shear pin intersects the covering housing and the support flat plate. The magnetic proof mass and the support flat plate may be a unified element. The magnetic proof mass has a persistent magnetic field (i.e.; a permanent magnet), and is attracted to the metal base plate, which has an upper face. Permanent magnets are strongly attracted to iron, nickel, cobalt, some alloys of rare earth metals.

The shear pins can withstand at least a five foot drop without shearing. The metal base plate has a center opening through which projects a coaxial impact pin. An upper surface of the impact pin extends from a position above the surface of metal base plate. A lower surface of the impact pin is substantially flush with a piezoelectric element, nominally mounted on a circuit board. The circuit board has a rectified circuit, a capacitor and leads to a low energy pyrotechnic initiator.

An aspect of the invention is when the magnetic proof mass may move, the magnetic attraction of the magnetic proof mass for the metal base plate produces a force stress against the upper surface of the impact pin, which extends above the surface of metal base plate, but does not contact the metal base plate until the piezoelectric element deforms to extend where there is contact. The force stress is translated onto a piezoelectric element to cause the crystal to strain producing a voltage that is collected by the capacitor.

A second aspect is that when a shell is fired, the setback force causes the shear pins to break as the support plate and the magnetic proof mass moves forward (toward the metal base plate), freeing the magnetic proof mass to then move forward at a fast rate drawn by the magnetic attraction toward the metal base plate (which can also be magnetic). The magnetic proof mass therein strikes the impact pin causing the piezoelectric element to strain under the stress, creating an electric current that is rectified and collected by the capacitor. The circuit enables the electrical current to be stored on the capacitor.

The high output voltage module contains a protective housing with a plurality of stacks of piezoelectric elements on a second circuit. A low energy pyrotechnic initiator is embedded in the stacks of piezoelectric elements. The low energy pyrotechnic initiator includes an explosive material that is susceptible to ignition by an electrical discharge, where the electrical discharge is either through or proximate to the low energy pyrotechnic initiator. When the charge on the capacitor in the low output voltage module is high enough to spark, then an electrical discharge can occur, igniting the pyrotechnic initiator, which produces a mechanical shockwave through the stacks of piezoelectric elements (PZT) enclosed in the protective housing. Accordingly, this status causes the stacks of piezoelectric elements of the high output voltage module to generate a much higher energy than was harvested by the low output voltage module, where the high output voltage module produces a sufficient electrical energy to function as a MEMS fuze. Nominally the fuze has a flex cable, used to carry high electrical power to for an explosive-train.

BRIEF DESCRIPTION OF THE DRAWINGS

The foregoing invention will become readily apparent by referring to the following detailed description and the appended drawings in which:

FIG. 2a is an enlarged cross-sectional partial view illustrating that the upper surface of the impact pin projects to a point above the surface of metal base plate;

FIG. 3 is an elevated perspective view of the low output voltage module of a micro-electro-pyrotechnic energy-harvesting apparatus, wherein elements obscured by the covering housing are shown in ghost as dashed lines;

FIG. 4 is an exploded view of the low output voltage module illustrating the relative position of the component elements of the low output voltage module;

DETAILED DESCRIPTION OF THE INVENTION

A micro-electro-pyrotechnic energy-harvesting apparatus, where the apparatus harvests a small portion of the setback force when a munition is fired, where the harvested energy shears off the shear pins that are restraining a magnetic proof mass. The attraction of the magnetic proof mass for an metal base plate that is underlying also produces some force on the shear pins as they are holding back the magnetic proof mass. Generally, the strength of the shear pins is sufficient to prevent premature actuation if the apparatus is dropped from about five feet or lower and lands on a hard surface, such as a concrete floor or a steel deck. It is not the fall but the landing where a perpendicular landing may result in instantaneous stoppage, therein producing high deceleration even at relatively low velocities (less than or equal to about 5.5 m/s) and high shear forces. The relatively small size of the apparatus reduces the mass, and helps prevent accidental shearing of the pins. It is anticipated that additional, safety shear pins may be employed before the munition is fired.

Figure 1:
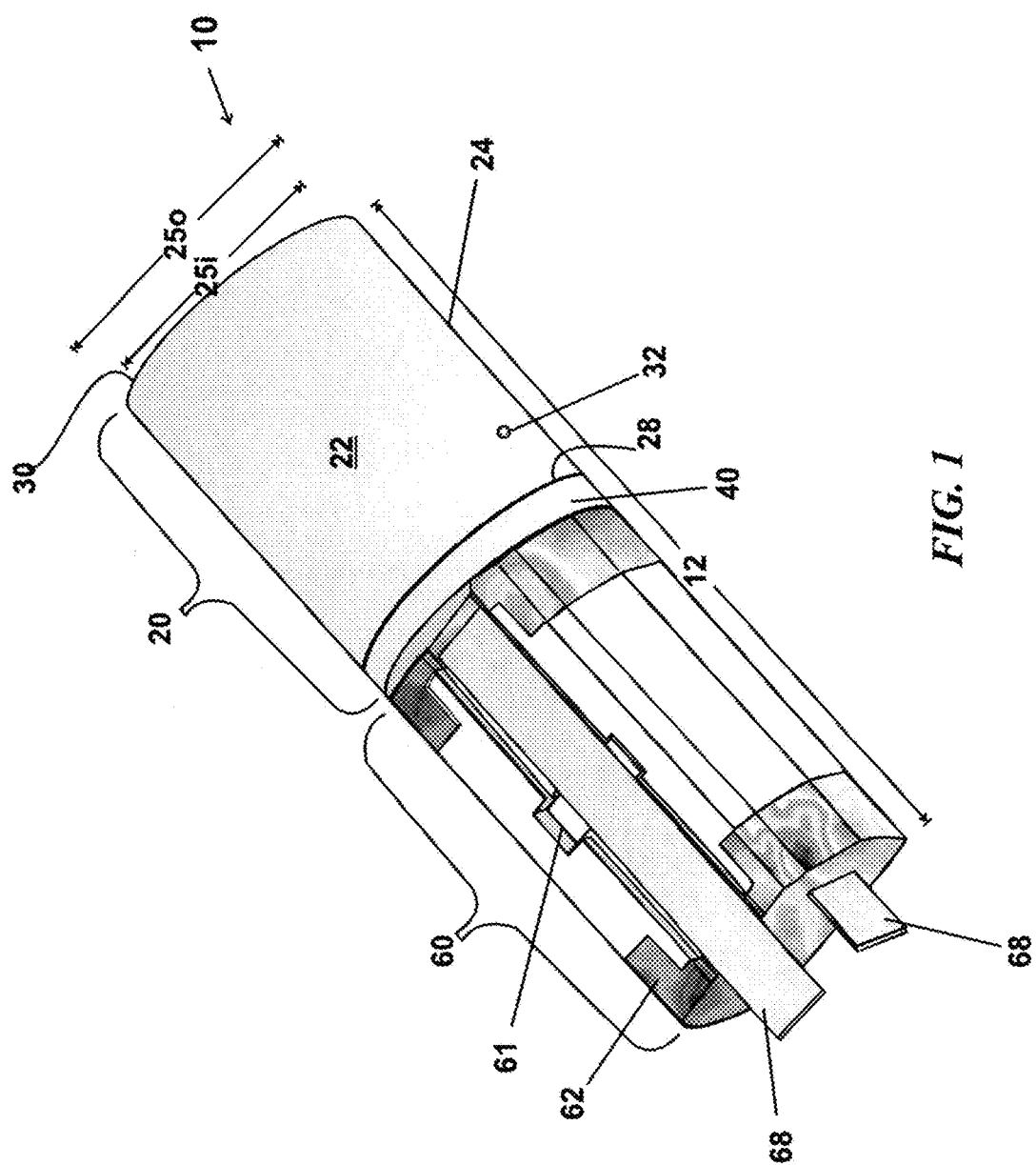
FIG. 1 is an elevated perspective view of a micro-electro-pyrotechnic energy-harvesting apparatus, wherein the apparatus includes a low output voltage module and a high output voltage module.

An illustrated embodiment of a micro-electro-pyrotechnic energy-harvesting apparatus 10 is shown in FIG. 1. The apparatus 10 has an overall length 12 that includes a low output voltage module 20 and a high output voltage module 60. The low output voltage module 20 includes a covering housing 22 having a sidewall 24 with an interior diameter 25i (also shown in FIG. 2) and an exterior diameter 25o (also shown in FIG. 2), an open bottom 28, a closed top wall 30, and a plurality of positions 32 (one shown) in the sidewall 24 that can receive a shear pin 42 (shown in FIG. 2, FIG. 4). The illustrated covering housing 22 is made of a plastic material to reduce weight, cost, and plastic materials are largely unaffected by a magnetic field. The sidewall 24 has interior threads 36 (as shown in FIG. 2) in a region proximate to the open bottom 28, that engage threads 46 on a metal base plate 40 that has an upper surface 41, and the open bottom 28 abuts the upper surface 41 (as shown in FIG. 2).

Some of the elements of the high output voltage module 60 are illustrated shown in FIG. 1. Most notably the high output voltage module 60 is aligned with the low output voltage module 20. The visible elements include a protective case 62, a slot 61 for the low energy pyrotechnic initiator connected to the electrical leads from the low output voltage module, and a pair of electrical cables 68.

Figure 2:
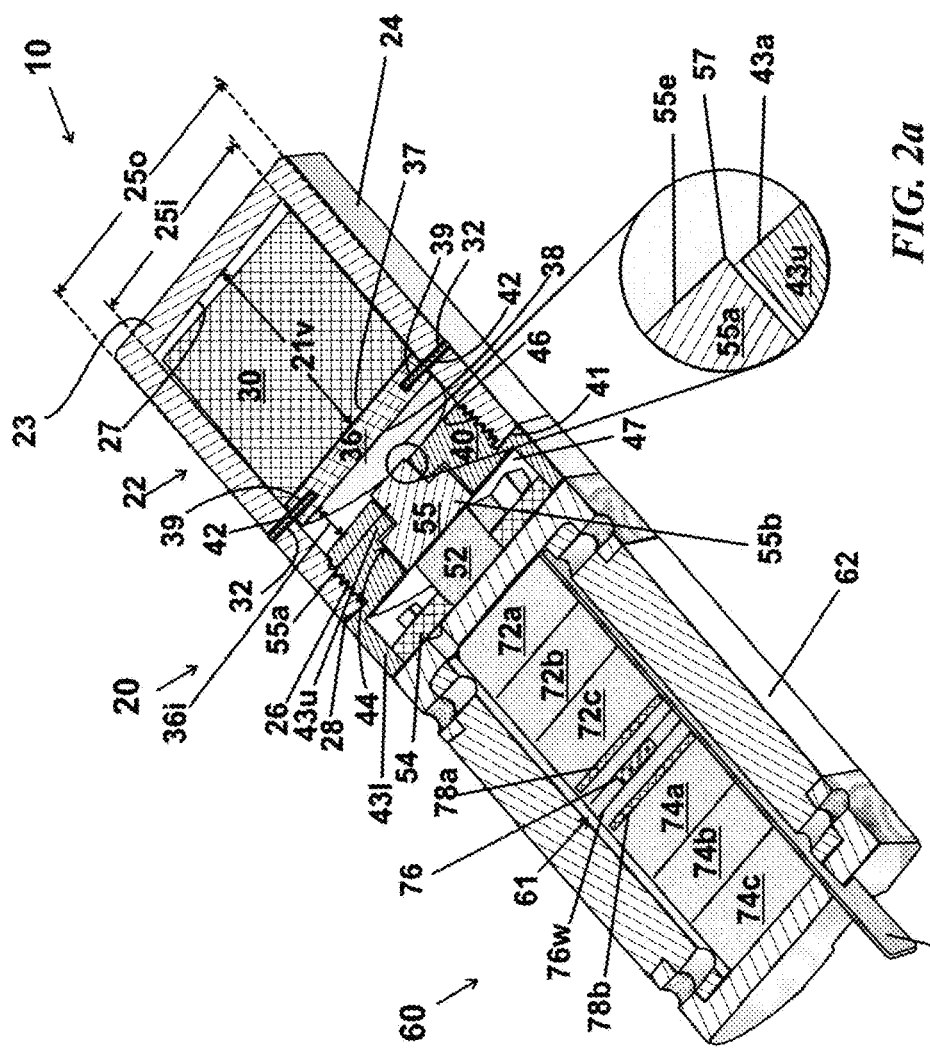
FIG. 2 is a cross-sectional view of the apparatus illustrated in FIG. 1.

The cross-sectional view of the apparatus illustrated in FIG. 1 is shown in FIG. 2. The covering housing 22 has a supporting plate 36 having at least two perimeter openings 39, where the supporting plate 36 is held in place by a plurality of shear pins 42. A shear pin 42 intersects the position 32 on the sidewall 24 and the opening 39 in the supporting plate 36. As previously stated, the shear pins are selected to shear-off when the munition is fired. The supporting plate partitions an interior of the covering housing into an upper volume and a lower volume. The upper volume is defined by an inside diameter 25i of the covering housing 22 and a length 21v between an upper surface 37 of the supporting plate 36 to an interior wall surface 27 of the closed top 23 of the covering housing 22. The lower volume is defined by the inside diameter 25i and a distance 36i measured from a surface 38 of the supporting plate 36 to an upper face 43a of a metal base plate 40.

A magnetic proof mass 30 occupies most of the upper volume, where prior to firing, the magnetic proof mass is restrained by the supporting plate 36 and the covering housing 22. The magnetic proof mass has a persistent magnetic field, with a magnetic attraction for the metal base plate 40.

Figure 7:
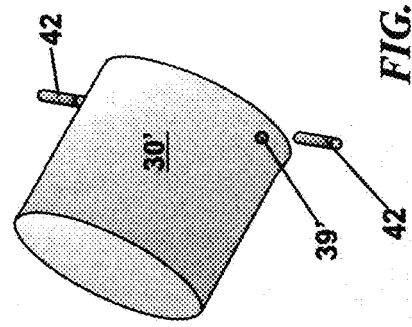
FIG. 7 is a perspective of a modified magnetic proof mass, wherein the magnetic proof mass has been modified to incorporate the support plate.

The relationship of the magnetic proof mass 30 and the support plate 36 is shown in FIG. 4. In a variation, as shown in FIG. 7, the magnetic proof mass 30' is elongated and fitted with shear pin holes 39' so that the support plate is no longer needed.

The metal base plate 40 has an upper surface 41 and a recessed rear portion 47, wherein an axial portion of the plate 40 has a smaller diameter protruding upper round portion 43u with an upper face 43a and, as shown in FIG. 3, a height 49 with exterior threads 46. The smaller diameter 43o of the upper round portion 43u is comparable to the interior diameter 25i of the covering housing 22, where the covering housing 22 is screwed onto the protruding upper round portion 43u until it abuts the upper surface 41 of the metal base plate 40.

The metal base plate 40 has an axial channel 44 that extends through the protruding upper round portion 43u that widens prior to exiting to the recessed rear portion 47. The axial channel 44 accommodates an impact pin 55. The impact pin 55 has a rod portion 55a that terminates in an end 55e and a flat-block pusher 55b with a lower surface 55l that is flush with a piezoelectric element 52. As shown in FIG. 2a, the end 55e of the rod portion 55a extends above the upper face 43a of upper round portion 43u of the metal base plate 40. The length of the extension defines a strain length 57 that is approximately the amount of strain that the underlying piezoelectric element 52 will be deformed before force is spread to the surrounding metal base plate 40.

Figure 5:
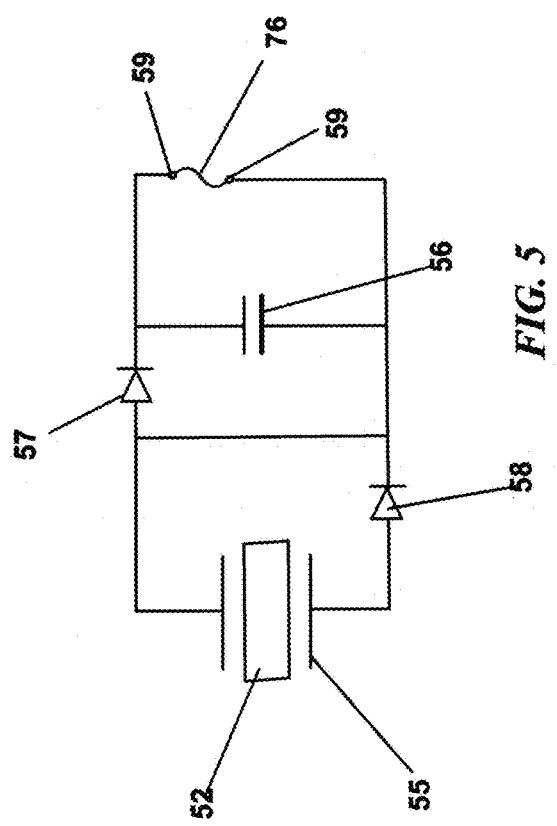
FIG. 5 is a schematic view illustrating how energy is harvested utilizing piezoelectric elements and magnetic energy to literally squeeze out electrons onto a capacitor.

As shown in FIG. 2 the piezoelectric element 52 is mounted on a circuit board 54 that is housed in the recessed rear portion 47 of the metal base plate 40. The circuit board is diagrammatically illustrated in FIG. 5. The rectified circuit is a full wave rectifier that inverts a negative wave into a positive wave, so that both positive and negative voltages generated by the piezoelectric element 52 are collected on the capacitor 56. In the circuit a first rectifier 57 passes (first) positive waves, a second rectifier 58 passes (second) positive wave coming from the other side of the piezoelectric element 52, and forwards it into the first rectifier 57, and all waves are collected on the capacitor 56. The voltage of the wave is arbitrarily positive if the piezoelectric element 52 is being strained, and negative as it relaxes. Depending on which side the rectifier is located, a wave is detected as positive or negative as it is strained or relaxed. A pair of connecting electrical leads 59 from the harvested low output voltage module 20 is connected to the low energy pyrotechnic initiator 76, which is physically located in the high voltage module 60.

The high output voltage module 60 has a protective case 62, the low energy pyrotechnic initiator 76 connected to the electrical leads 59 from the low output voltage module 20, and a plurality of a stack of piezoelectric elements 72a,72b, 72c, 74a, 74b, 74c, where each stack has three piezoelectric elements. Of several suitable materials for a piezoelectric element, lead zirconate titanate is both performance and costs effective. The high output voltage module 60 in the exemplary embodiment includes a pair of electrical cables 58 as shown in FIG. 1. The low energy pyrotechnic initiator 76 may utilize bridge wires 76w that generate heat to initiate an explosive material, ultimately resulting in a shockwave. The heated bridgewire 76w is a bridge resistor, which may ignite a first explosive, and may, optionally, ignite a second explosive, where the pyrotechnic initiator produce a slow shock wave that imitates a mechanical shock wave versus a high explosive shock wave. In the exemplary embodiment, the illustrated pyrotechnic initiator 76 is separated from the stack of piezoelectric elements by an expansion wall 78a, 78b, which helps distribute the force more uniformly over the stack of piezoelectric elements.

In the exemplary embodiment, the total volume of the apparatus is about 2.3 ml+/−about 1.0 ml, the diameter 25o is about 1.05 cm+/−about 0.5 cm, and the length 12 is 3.0 cm+/−about 1.0 cm. The low output voltage module attains approximately about eight volts. The high output voltage module may generate up to approximately about one hundred fifty volts. The low energy pyrotechnic initiator 76 requires about 40 to about 100 micro Joules.

In illustrated exemplary apparatus, a portion of the plurality of stacks of piezoelectric elements 72a,72b,72c, is used to generate electrical power to remove a lock and run electronic assembly (not shown). The remaining portion of the plurality of stacks of piezoelectric elements 74a,74b,74c provides high electrical power to actuate a MEMS explosive-train.

Figures 6, 6A:
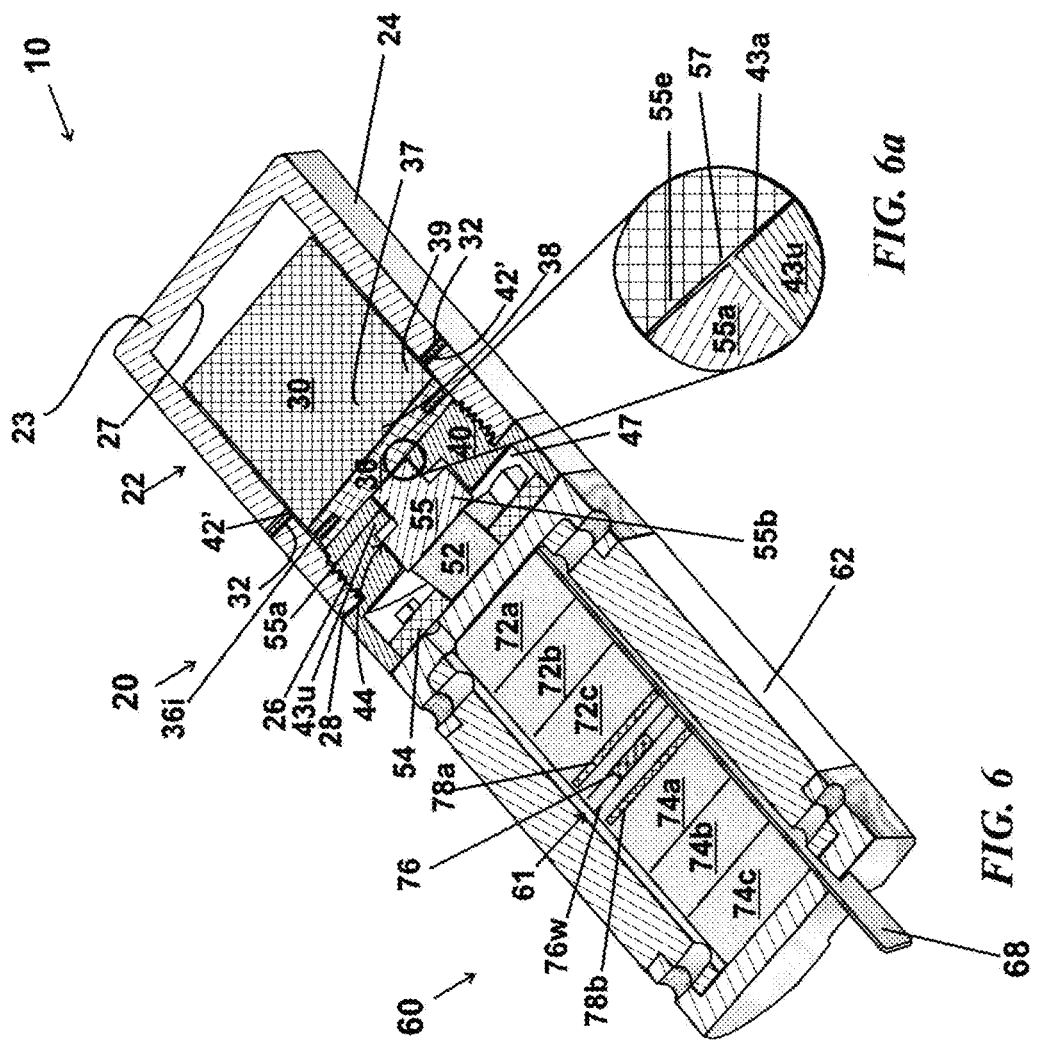
FIG. 6 is a cross-sectional view of the apparatus illustrated in FIG. 2, with the exception that the shear pins are sheared, and the upper surface of the impact pin has been forced against a piezoelectric element, causing deformation of the piezoelectric element, which is lead zirconate titanate (PZT)
FIG. 6a is an enlarged cross-sectional partial view illustrating that the upper surface of the impact pin is level with the surface of the metal base plate, where the magnetic attraction of the magnetic proof mass for the metal base plate (due to magnetic extraction forces between the magnet and metal plate) and the setback force have created enough energy to produce the deformation of the PZT crystal and the accompanying change in voltage.

FIG. 6 illustrates the apparatus illustrated in FIG. 2, after the shear pins 42' are sheared. The lower surface of the impact pin 55 has been forced against the piezoelectric element 52 by the magnetic proof mass 30, because of its attraction for the metal base plate 40, therein producing a low voltage output that is collected on the capacitor 56.

In FIG. 6a the upper surface of the impact pin is level with the surface of the metal base plate. The magnetic attraction of the magnetic proof mass 30 for the metal base plate (due to magnetic extraction forces between the magnet and metal base plate 40) and the setback force create enough energy to produce the deformation of the PZT element and the accompanying change in voltage.

Finally, any numerical parameters set forth in the specification and attached claims are approximations (for example, by using the term "about") that may vary depending upon the desired properties sought to be obtained by the present invention. At the very least, and not as an attempt to limit the application of the doctrine of equivalents to the scope of the claims, each numerical parameter should at least be construed in light of the number of significant digits and by applying ordinary rounding.

What is claimed is:

1. An energy harvesting apparatus for a munition, comprising:
   a low output voltage module comprising:
      a covering housing including a sidewall with an interior diameter and an exterior diameter, an open bottom, a closed top wall, and a plurality of positions in the sidewall for receiving a shear pin, where an interior region of the sidewall being proximate to the open bottom is threaded;
      a plurality of shear pins;
      a supporting plate including a plurality of perimeter perforations, wherein the supporting plate is held in place by a plurality of shear pins which intersect the positions on the covering housing and the perimeter perforations in the supporting plate, wherein the shear pins are sheared when the munition is fired, wherein the supporting plate partitions an interior of the covering housing into an upper volume defined by an upper surface of the supporting plate to the closed top wall of the covering housing, and wherein a lower volume is situated below the supporting plate;
      a magnetic proof mass occupying the upper volume, wherein prior to firing, the magnetic proof mass is restrained by the supporting plate and the covering housing, and wherein the magnetic proof mass has a persistent magnetic field;
      a metal base plate including an upper surface and a recessed rear portion, wherein a center of the plate includes a smaller diameter protruding upper round portion with an upper face and a height with an exterior threaded perimeter, wherein said smaller diameter is comparable to the interior diameter of the covering housing, whereby the covering housing is screwed onto the protruding upper round portion until it abuts the upper surface of the metal base plate, and wherein said metal base plate furthermore includes an axial channel that extends through the protruding upper round portion, which widens proximate to the recessed rear portion;
      an impact pin including a rod portion terminating in an end and a flat-block pusher with a lower surface, wherein the impact pin is fitted in the axial channel extending a strain length above the upper face of the protruding upper round portion, and wherein when the shear pins are sheared, force is applied to the end of the rod, which is conveyed to the flat-block pusher to move a maximum distance defined by the strain length;
      a piezoelectric element being flush with the lower surface of the impact pin, wherein the piezoelectric element is mounted on a circuit board housed in the recessed rear portion of the metal base plate, and wherein the circuit board includes a rectified circuit, a capacitor and connecting electrical leads; and
   a high output voltage module comprising a protective case; a low energy pyrotechnic initiator connected to the electrical leads from the low output voltage module; a plurality of a stack of piezoelectric elements; and a pair of electrical cables,
      wherein when the shear pins are sheared, the magnetic proof mass accelerates toward the metal base plate to hit the end of the impact pin, which extends above the upper face of the metal base plate, to cause the flat-block pusher to strain the piezoelectric element and produce a current, wherein the current is collected by the capacitor until it has a voltage that is sufficient to actuate the low energy pyrotechnic initiator, and wherein when actuated the low energy pyrotechnic initiator generates a shock wave to cause the plurality of the stack of piezoelectric elements to strain and therein generate a high voltage output carried by the pair of electrical cables.

2. The apparatus according to claim 1, wherein the low output voltage module attains about eight volts.

3. The apparatus according to claim 1, wherein the high output voltage module generates up to about one hundred fifty volts.

4. The apparatus according to claim 1, wherein the apparatus includes a total volume of about 2.3 ml+/−about 1.0 ml, a diameter of about 1.05 cm+/−about 0.5 cm, and a length of about 3.0 cm+/−about 1.0 cm.

5. The apparatus according to claim 1, wherein the piezoelectric element is comprised of lead zirconate titanate.

6. The apparatus according to claim 1, wherein the low energy pyrotechnic initiator requires about 40 to about 100 micro Joules.

7. The apparatus according to claim 1, wherein a portion of the plurality of stacks of piezoelectric elements generates electrical power to remove a lock and run an electronic assembly, and wherein a remaining portion provides high electrical power to function a MEMS explosive-train.

8. The apparatus according to claim 1, wherein the rectified circuit is a full wave rectifier to invert a negative wave into a positive wave, so that both the positive wave and the negative wave generated by the piezoelectric element are collected on the capacitor.

9. The apparatus according to claim 1, wherein a stack of piezoelectric elements is comprised of at least two piezoelectric elements.

10. The apparatus according to claim 1, wherein the pyrotechnic initiator is actuated by one of a heated bridgewire and a bridge resistor, to ignite a first explosive and optionally ignite a second explosive, and wherein the pyrotechnic initiator produces a slow shock wave to imitate a mechanical shock wave versus a high explosive shock wave.

11. An energy harvesting apparatus for a munition, comprising:
a low output voltage module comprising:
a covering housing including a sidewall with an interior diameter and an exterior diameter, an open bottom, a closed top wall, and a plurality of positions in the sidewall for receiving a shear pin, where an interior region of the sidewall being proximate to the open bottom is threaded;
a plurality of shear pins;
a magnetic proof mass including a persistent magnetic field and a plurality of perimeter perforations,
wherein the magnetic proof mass is held in place by said plurality of shear pins, which interest the positions on the covering housing and the perimeter perforations in the magnetic proof mass,
wherein the shear plurality of shear pins are sheared when the munition is fired, and
wherein the magnetic proof mass partitions an interior of the covering housing into an upper volume occupied by the magnetic proof mass, and a lower volume that is below the magnetic roof mass;
a metal base plate including an upper surface and a recessed rear portion, wherein a center of the plate includes a smaller diameter protruding upper round portion with an upper face and a height with an exterior threaded perimeter, wherein said smaller diameter is comparable to the interior diameter of the covering housing, whereby the covering housing is screwed onto the protruding upper round portion until it abuts the upper surface of the metal base plate, and wherein said metal base plate furthermore includes an axial channel that extends through the protruding upper round portion, which widens in the recessed rear portion;
an impact pin including a rod portion terminating in an end and a flat-block pusher with a lower surface, wherein the impact pin is fitted in the axial channel extending a strain length above the upper face of the protruding upper round portion, and wherein when the shear pins are sheared, force is applied to the end of the rod, which is conveyed to the flat-block pusher to move a maximum distance defined by the strain length;
a piezoelectric element being flush with the lower surface of the impact pin, wherein the piezoelectric element is mounted on a circuit board housed in the recessed rear portion of the metal base plate, and wherein the circuit board includes a rectified circuit, a capacitor and connecting electrical leads; and
a high output voltage module comprising a protective case; a low energy pyrotechnic initiator being connected to the electrical leads from the low output voltage module; a plurality of a stack of piezoelectric elements; and a pair of electrical cables,
wherein when the shear pins are sheared, the magnetic proof mass accelerates toward the metal base plate to hit the end of the impact pin, which extends above the upper face of the metal base plate, to cause the flat-block pusher to strain the piezoelectric element and produce a current, wherein the current is collected by the capacitor until it has a voltage that is sufficient to actuate the low energy pyrotechnic initiator, and wherein when actuated the low energy pyrotechnic initiator generates a shock wave to cause the plurality of the stack of piezoelectric elements to strain and therein generate a high voltage output carried by the pair of electrical cables.

12. The apparatus according to claim 11, wherein the low output voltage module attains about eight volts.

13. The apparatus according to claim 11, wherein the high output voltage module generates up to about one hundred fifty volts.

14. The apparatus according to claim 11, wherein the apparatus includes a total volume of about 2.3 ml+/−about 1.0 ml, a diameter that is about 1.05 cm+/−about 0.5 cm, and a length that is about 3.0 cm+/−about 1.0 cm.

15. The apparatus according to claim 11, wherein the piezoelectric element is comprised of lead zirconate titanate.

16. The apparatus according to claim 11, wherein the low energy pyrotechnic initiator requires about 40 to about 100 micro-Joules.

17. The apparatus according to claim 11, wherein a portion of the plurality of stacks of piezoelectric elements generates electrical power to remove a lock and run an electronic assembly, and wherein a remaining portion provides high electrical power to function a MEMS explosive-train.

18. The apparatus according to claim 11, wherein the rectified circuit is a full wave rectifier to invert a negative wave into a positive wave, so both said positive wave and said negative waves generated by the piezoelectric element are collected on the capacitor.

19. The apparatus according to claim 11, wherein a stack of piezoelectric elements is comprised of at least two piezoelectric elements.

20. The apparatus according to claim 11, wherein the pyrotechnic initiator is actuated to use one of a heated bridgewire and a bridge resistor, which ignites a first explosive, and optionally ignite a second explosive, and wherein the pyrotechnic initiator produces a slow shock wave to imitate a mechanical shock wave versus a high explosive shock wave.

* * * * *